(12) United States Patent  
Miura

(10) Patent No.: US 6,900,062 B2
(45) Date of Patent: May 31, 2005

(54) METHOD OF MANUFACTURING A SEMICONDUCTOR DEVICE UTILIZING ACTIVE OXYGEN

(75) Inventor: Kazutaka Miura, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/604,866

(22) Filed: Aug. 22, 2003

(65) Prior Publication Data

US 2004/0147046 A1 Jul. 29, 2004

(30) Foreign Application Priority Data

Aug. 30, 2002 (JP) ........................................ 2002-253234

(51) Int. Cl.⁷ ...................... H01L 21/00; H01L 21/8242
(52) U.S. Cl. ........................ 438/3; 438/240; 438/253
(58) Field of Search ............................ 438/3, 240, 253

(56) References Cited

U.S. PATENT DOCUMENTS 6,114,199 A * 9/2000 Isobe et al. ................. 438/240

6,368,909 B2 * 4/2002 Koo ............................ 438/240
2003/0064604 A1 * 4/2003 Umeda ........................ 438/745
2003/0141527 A1 * 7/2003 Joo et al. .................... 257/295

FOREIGN PATENT DOCUMENTS

JP          11-330390       11/1999

* cited by examiner

Primary Examiner—Thanh Nguyen
(74) Attorney, Agent, or Firm—Westerman, Hattori, Daniels & Adrian, LLP

(57) ABSTRACT

There are provided the steps of forming a first conductive layer, an oxide dielectric layer, and a second conductive layer sequentially over a first insulating layer formed over a semiconductor substrate, forming a capacitor consisting of an upper electrode, a dielectric layer, and a lower electrode made by patterning the second conductive layer, the oxide dielectric layer, and the first conductive layer, forming a second insulating layer over the capacitor and the first insulating layer, forming a hole in the second insulating layer on the upper electrode, and supplying an activated oxygen to the capacitor via the hole in a state that the semiconductor substrate is heated.

17 Claims, 12 Drawing Sheets

METHOD OF MANUFACTURING A SEMICONDUCTOR DEVICE UTILIZING ACTIVE OXYGEN

CROSS REFERENCE TO RELATED APPLICATIONS

This application is based upon and claims priority of Japanese Patent Application No. 2002-253234, filed on Aug. 30, 2002, the contents being incorporated herein by reference.

1. Field of the Invention

The present invention relates to a method of manufacturing a semiconductor device and, more particularly, a method of manufacturing a semiconductor device having a capacitor.

2. Description of the Prior Art

As the nonvolatile memory that is able to store information after a power supply is turned OFF, a flash memory or a ferroelectric memory (FeRAM) is known.

The flash memory has a floating gate that is buried in a gate insulating layer of an insulated gate field effect transistor (IGFET), and stores the information by storing a charge as the stored information in the floating gate. A tunnel current must be supplied to the gate insulating layer to write/erase the information, and thus a relatively high voltage is needed.

The FeRAM has a ferroelectric capacitor that stores the information by utilizing the hysteresis characteristic of a ferroelectric substance. In the ferroelectric capacitor, a ferroelectric layer that is formed between an upper electrode and a lower electrode generates the polarization in response to the voltage value applied between the upper electrode and the lower electrode and also has the spontaneous polarization that still holds the polarization after an applied voltage is removed. The information can be read by sensing a polarity and a magnitude of this spontaneous polarization.

The FeRAM has such advantages that such FeRAM operates at a voltage lower than the flash memory and that a high-speed writing can be attained while saving a power.

The ferroelectric capacitor that is employed in the memory cell of the FeRAM is formed by the steps shown in FIGS. 1A to 1C, for example.

First, as shown in FIG. 1A, a first metal layer 103, a ferroelectric layer 104, and a second metal layer 105 are formed on a first interlayer insulating layer 102 that covers a silicon substrate 101. For example, a platinum layer is formed as the first metal layer 103, an oxide dielectric substance such as PZT is formed as the ferroelectric layer 104, and iridium or iridium oxide is formed as the second metal layer 105.

Then, as shown in FIG. 1B, the second metal layer 105 is patterned into an upper electrode 105a of a capacitor $Q_0$, and then the ferroelectric layer 104 is patterned into a dielectric layer 104a of the capacitor $Q_0$. Then, the first metal layer 103 is patterned into a lower electrode 103a of the capacitor $Q_0$.

Then, as shown in FIG. 1C, the capacitor $Q_0$ is covered with a second interlayer insulating layer 106 made of silicon oxide. Then, a first contact hole is formed on a contact area of the lower electrode 103a by patterning the second interlayer insulating layer 106. Then, a conductive plug 107 is buried in the first contact hole. Then, a second contact hole 106a is formed on the upper electrode 105a by patterning the second interlayer insulating layer 106. Then, an upper electrode leading wiring (not shown), which is connected to the upper electrode 105a via the second contact hole 106a, and a lower electrode leading wiring (not shown), which is connected to the conductive plug 107, are formed on the second interlayer insulating layer 106.

Meanwhile, the contact hole 106a on the upper electrode 105a is formed by using the dry etching. Therefore, the ferroelectric layer 104 is damaged by such dry etching and thus the capacitor characteristics are deteriorated.

Also, if a metal such as iridium, iridium oxide, or the like is employed as the upper electrode 105a, oxygen in PZT constituting the ferroelectric layer 104 is absorbed into the metal at the boundary between this metal and the ferroelectric layer 104, and thus the characteristics of the capacitor become worse. In particular, the oxygen in the ferroelectric layer 104 is ready to be absorbed into the upper electrode 105a at the time of formation of the second interlayer insulating layer 106 executed by the heat treatment.

For this reason, if the silicon substrate 101 is put in the oxygen atmosphere after the formation of the contact hole 106a and then the substrate temperature is set to about 550° C., the oxygen is supplied to the ferroelectric layer 104 via the contact hole 106a. Thus, the characteristics of the capacitor $Q_0$ can be recovered.

By the way, with the miniaturization of the upper electrode leading electrode, a size of the contact hole 106a formed on the upper electrode 105a must be reduced much more.

However, if the size of the contact hole 106a is reduced, an amount of oxygen that is supplied to the capacitor $Q_0$ via the contact hole 106a is also reduced. Thus, the oxygen is not supplied to the dielectric layer 104a to such an extent that the oxygen defect in the capacitor, which is caused by the etching or the like applied to form the contact hole 106a, can be filled up. As a result, improvement in the quality of the ferroelectric layer becomes insufficient and a quantity of polarization charge in the ferroelectric capacitor is lowered, which interferes with the writing/reading the information into/from the memory cell.

SUMMARY OF THE INVENTION

It is an object of the present invention to provide a method of manufacturing a semiconductor device containing the step of further improving characteristics of a capacitor having an oxide dielectric layer.

According to one aspect of the present invention, there is provided a method of manufacturing a semiconductor device comprising the steps of: forming a first insulating layer over a semiconductor substrate; forming a first conductive layer, an oxide dielectric layer, and a second conductive layer over the first insulating layer; forming a capacitor, which consists of an upper electrode made of the second conductive layer, a dielectric layer made of the oxide dielectric layer, and a lower electrode made of the first conductive layer, by patterning the second conductive layer, the oxide dielectric layer, and the first conductive layer; forming a second insulating layer over the capacitor and the first insulating layer; forming a hole in the second insulating layer on the upper electrode; and supplying an activated oxygen to the capacitor via the hole in a state that the semiconductor substrate is heated.

According to the present invention, the activated oxygen, e.g., oxygen radical, is supplied to the capacitor via the hole formed on the capacitor upper electrode while heating the semiconductor substrate having the capacitor.

Therefore, the oxygen is ready to permeate in the capacitor via the hole formed on the capacitor upper electrode. As a result, an enough amount of oxygen can be supplied to the oxide dielectric layer of the capacitor, and thus improvement in the capacitor characteristics by the oxygen annealing can be achieved even if the hole is reduced in size.

As the method of activating the oxygen, there are the method of irradiating the ultraviolet rays to the oxygen gas and the method of irradiating the microwave to the oxygen gas, for example. The oxygen gas is selected from any one of $O_2$, $N_2O$, $NO_2$, etc.

In case the ultraviolet lamps having wavelength peaks at 225.0 nm and 187.5 nm are employed to irradiate the ultraviolet rays, $O_2$ is changed into the ozone ($O_3$) by the ultraviolet rays having the wavelength of 225.0 nm and then this ozone is changed into the oxygen radical by the ultraviolet rays having the wavelength of 187.5 nm, whereby the oxygen is brought into the state that it is coupled easily with the oxide dielectric layer. Also, in case the excimer UV lamps are employed to irradiate the ultraviolet rays, $O_2$ is changed into the oxygen radical by the ultraviolet rays having the wavelength of 172.5 nm.

In addition, in case the microwave is irradiated onto the oxygen gas, the oxygen is activated and its permeability into the capacitor is enhanced.

DESCRIPTION OF THE PREFERRED EMBODIMENTS

Embodiments of the present invention will be explained with reference to the drawings hereinafter.
(First Embodiment)

FIGS. 2A to 2M are sectional views showing the steps of manufacturing a semiconductor device according to a first embodiment of the present invention.

Figure 1A:
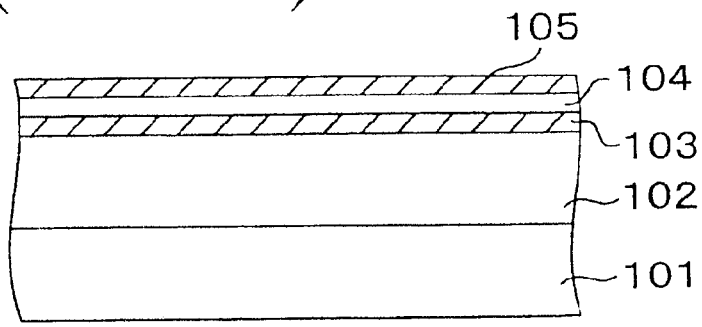
FIGS. 1A to 1C are sectional views showing the steps of forming a ferroelectric capacitor in the prior art.
Figure 1B:
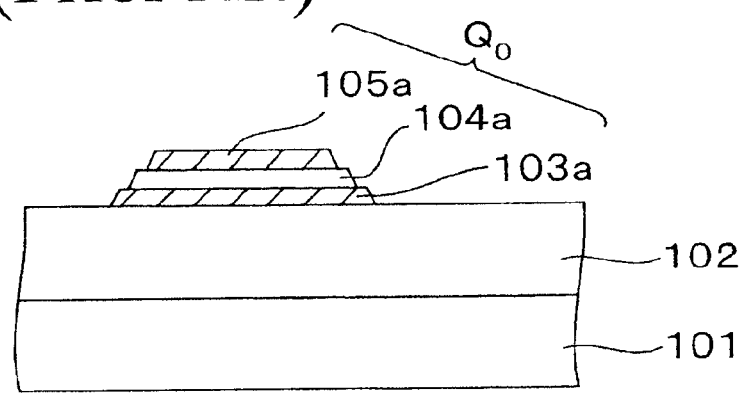
Figure 1C:
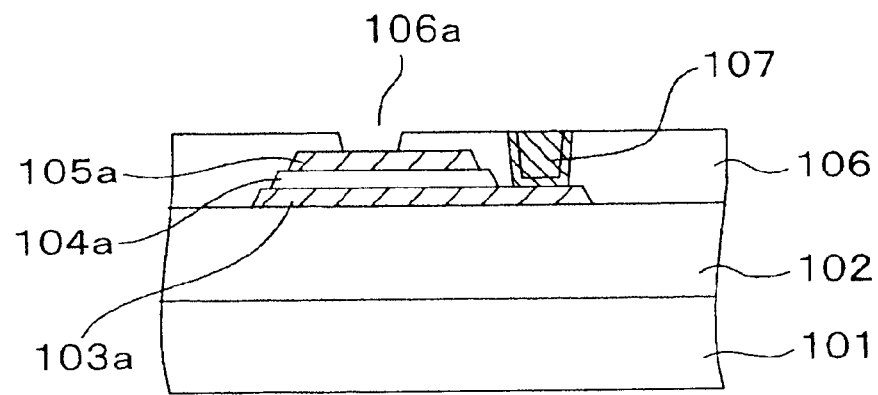
Figure 2A:
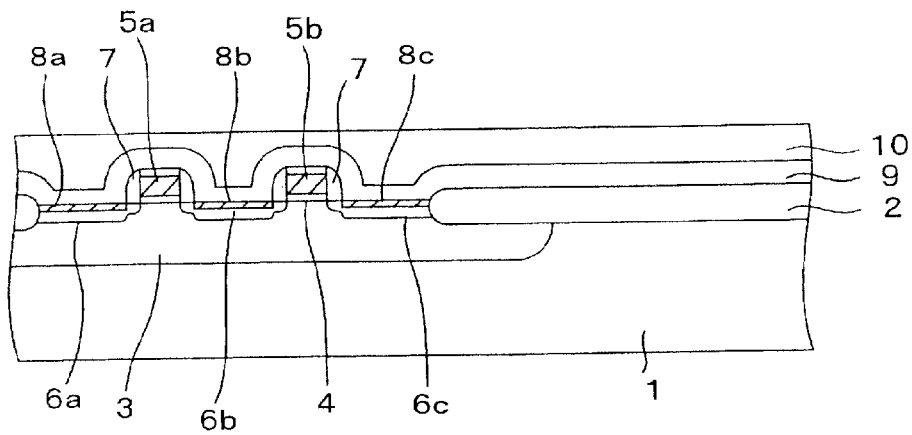
FIGS. 2A to 2M are sectional views showing the steps of manufacturing a semiconductor device according to a first embodiment of the present invention.

Steps required until a sectional structure shown in FIG. 2A is formed will be explained hereunder.

First, an element isolation insulating layer 2 is formed around an active region (transistor forming region) of a silicon substrate 1 by the LOCOS (Local Oxidation of Silicon) method. In this case, the STI (Shallow Trench Isolation) structure may be employed as the element isolation insulating layer 2.

Then, a p-well 3 is formed by introducing the p-type impurity into the active region in the memory cell region of the silicon substrate 1. Then, a silicon oxide layer serving as a gate insulating layer 4 is formed by thermally oxidizing a surface of the active region of the silicon substrate 1.

Then, an amorphous silicon or polysilicon layer and a silicide layer are formed sequentially on an overall upper surface of the silicon substrate 1. Gate electrodes 5a, 5b are formed by patterning the silicon layer and the silicide layer by virtue of the photolithography method. In this case, there are layers made of tungsten silicide, cobalt silicide, etc. as the silicide layer.

Two gate electrodes 5a, 5b are arranged in almost parallel at an interval on each p-well 3 in the memory cell region. These gate electrodes 5a, 5b constitute a part of the word line.

Then, the n-type impurity is ion-implanted into the p-well 3 on both sides of the gate electrodes 5a, 5b. Thus, n-type impurity diffusion regions 6a, 6b, 6c serving as the source/drain of the n-channel MOS transistors are formed.

Then, an insulating layer is formed on an overall surface of the silicon substrate 1. Then, sidewall insulating layers 7 are left only on both side portions of the gate electrodes 5a, 5b by etching back the insulating layer. As the insulating layer, silicon oxide ($SiO_2$) is formed by the CVD method, for example.

Then, the n-type impurity is ion-implanted again into the p-well 3 by using the gate electrodes 5a, 5b and the sidewall insulating layers 7 as a mask. Thus, the n-type impurity diffusion regions 6a to 6c are formed as the LDD structure.

As described above, in the memory cell region, a first MOS transistor consists of one gate electrode 5a, the n-type impurity diffusion regions 6a, 6b, etc. and a second MOS transistor consists of the other gate electrode 5b, the n-type impurity diffusion regions 6b, 6c, etc.

Then, a refractory metal layer is formed on an overall surface. Then, refractory metal silicide layers 8a to 8c are formed on surfaces of the n-type impurity diffusion regions 6a to 6c respectively by heating this refractory metal layer. Then, the unreacted refractory metal layer is removed by the wet etching. As the refractory metal, there are cobalt, tantalum, etc.

Then, a silicon oxide nitride (SiON) layer of about 200 nm thickness is formed as an oxidation preventing insulating layer 9 on the overall surface of the silicon substrate 1 by the plasma CVD method. Then, a silicon dioxide ($SiO_2$) layer of about 600 nm thickness is formed as a first interlayer insulating layer 10 on the oxidation preventing insulating layer 9 by the plasma CVD method using the TEOS gas.

Then, the first interlayer insulating layer 10 is thinned by the chemical mechanical polishing (CMP) method to planarize its surface. A polished amount of the first interlayer insulating layer 10 is set such that the layer is left by about 785 nm on the element isolation insulating layer 2.

Figure 2B:
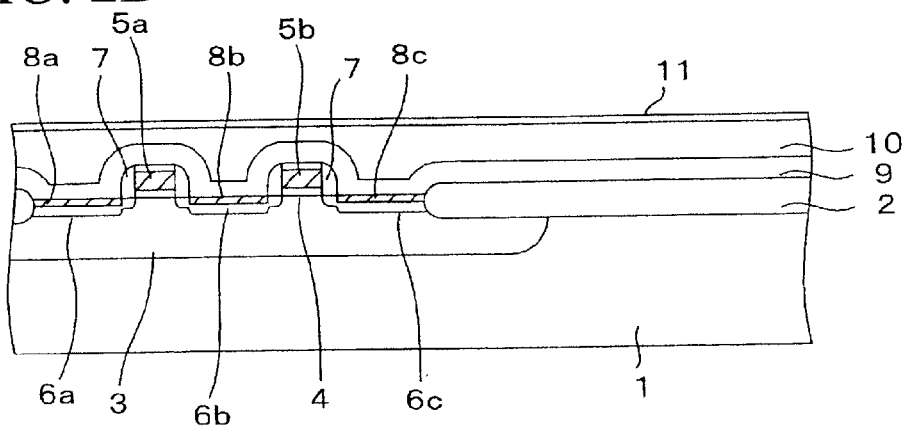

Then, as shown in FIG. 2B, a titanium oxide layer 11 having a rutile-type crystal structure is formed on the first interlayer insulating layer 10. The titanium oxide layer 11 is formed by forming a titanium layer on the first interlayer insulating layer 10 by the sputter method to have a thickness of about 20 nm, and then thermally oxidizing the titanium layer. The thermal oxidation of the titanium layer at the substrate temperature of 700° C. for 60 second in the oxygen atmosphere, for example, by using the RTA (Rapid Thermal Annealing) equipment. Thus, the oxidized titanium layer gives the titanium oxide layer 11 of about 50 nm thickness, and a (200) face appears on its upper surface.

Figure 2C:
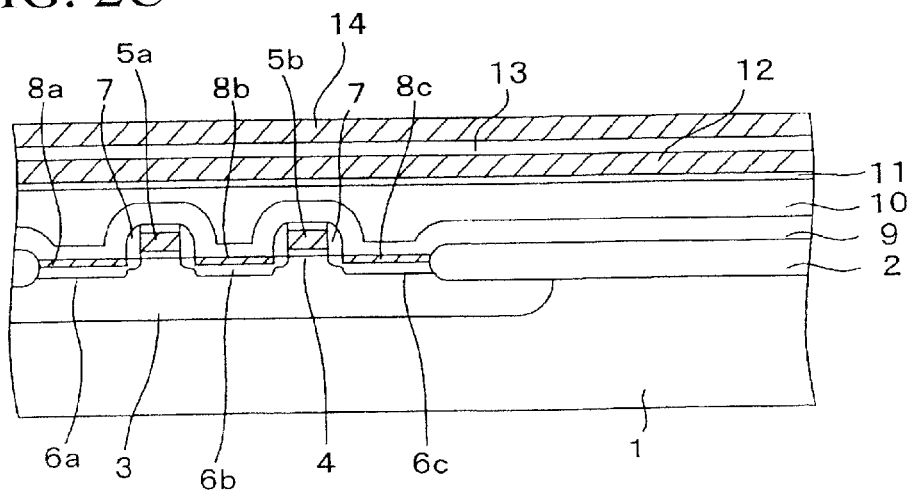

Next, steps required until a structure shown in FIG. 2C formed will be explained hereunder.

First, a platinum (Pt) layer is formed as a first conductive layer 12 on the titanium oxide layer 11. A thickness of the Pt layer is set to about 100 to 300 nm, for example, 150 nm. Here, the titanium oxide layer 11 performs the role to improve the adhesion between the first conductive layer 12 and the first interlayer insulating layer 10. In this case, a titanium layer and a platinum layer may be formed in place of the titanium oxide layer 11 and the first conductive layer 12.

The first conductive layer 12 is not limited to the platinum. A noble metal layer made of iridium, ruthenium, or the like, or a noble metal oxide layer made of ruthenium oxide, strontium ruthenium oxide ($SrRuO_3$), or the like may be employed as the first conductive layer 12.

Then, PLZT (lead lanthanum zirconate titanate; ($Pb_{1-3x/2}La_x)(Zr_{1-y}Ti_y)O_3$) of 100 to 300 nm thickness, for example, 180 nm thickness, is formed as a ferroelectric layer 13 on the first conductive layer 12 by the sputtering method.

In this case, as the method of forming the ferroelectric layer 13, there are the spin-on method, the MOD (Metal Organic Deposition) method, the MOCVD (Metal Organic CVD) method, the sol-gel method, etc. in addition to the above. Also, as the material of the ferroelectric layer 13, there are other PZT material such as PLCSZT, PZT, or the like, Bi-layered structure compound material such as $SrBi_2Ta_2O_9$, $SrBi_2(Ta,Nb)_2O_9$, or the like, and other metal oxide ferroelectric substance in addition to PLZT.

Then, the PLZT layer constituting the ferroelectric layer 13 is crystallized by the RTA (Rapid Thermal Annealing) in the oxygen-containing atmosphere. The RTA conditions are set to 585° C., 90 second, and the programming rate of 125° C./sec, for example. In this case, oxygen and argon are introduced into the oxygen-containing atmosphere, and an oxygen concentration is 2.5%, for example.

Then, an iridium (Ir) layer and an iridium oxide ($IrO_x$) layer are formed sequentially as a second conductive layer 14 on the ferroelectric layer 13 by the sputter method to have a total thickness of 100 to 300 nm, for example, 150 nm. In this case, as the second conductive layer 14, a platinum layer, a strontium ruthenium oxide (SRO) layer, and other metal layer may be formed by the sputter method.

Then, crystallinity of the ferroelectric layer 13 is improved by the RTA in the oxygen-containing atmosphere. The RTA conditions are set to 725° C., 20 second, and the programming rate of 125° C./sec, for example. In this case, the oxygen and the argon are introduced into the oxygen-containing atmosphere, and the oxygen concentration is 1.0%, for example.

Figure 2D:
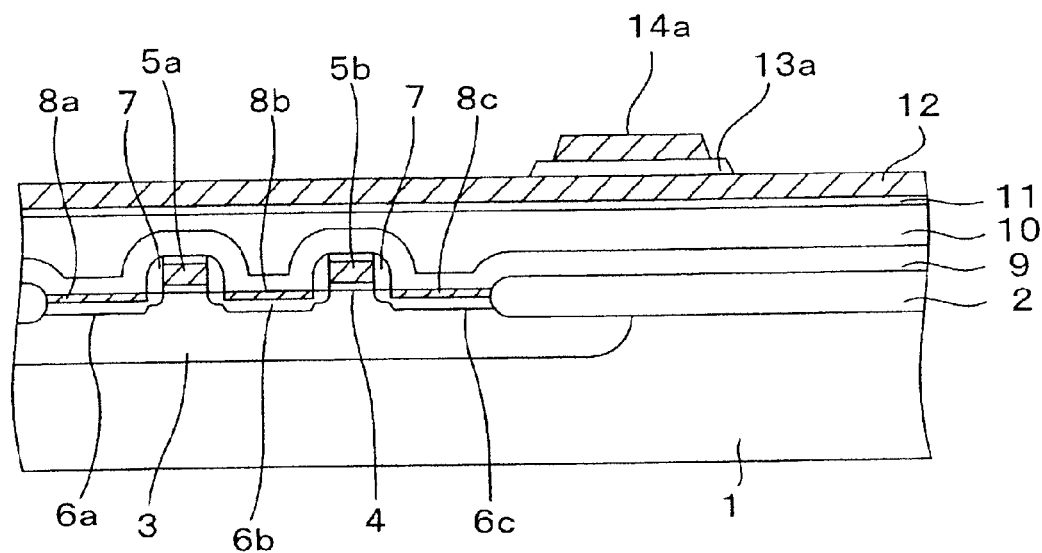

Next, steps required until a structure shown in FIG. 2D is formed will be explained hereunder.

First, the second conductive layer 14 is patterned by the photolithography method using a resist pattern (not shown). Thus, an upper electrode 14a of a capacitor Q is formed over the element isolation insulating layer 2 in vicinity of the first and third n-type impurity diffusion regions 6a, 6c. In this case, the capacitor Q formed in vicinity of the first n-type impurity diffusion region 6a is omitted from the illustration because such capacitor has the same structure as the capacitor Q formed in vicinity of the third n-type impurity diffusion region 6c.

Then, the resist pattern is removed. Then, the ferroelectric layer 13 is annealed at the temperature of 650° C. for 60 minute in the oxygen atmosphere. This annealing is executed to recover the quality of the ferroelectric layer 13 from the damage that is caused due to the sputtering and the etching.

Then, in the memory cell region, the ferroelectric layer 13 is etched in the situation that the resist pattern (not shown) is still formed on the upper electrode 14a and its periphery. Thus, the remaining ferroelectric layer 13 is used as a dielectric layer 13a of the capacitor Q. Then, the resist pattern is removed.

Figure 2E:
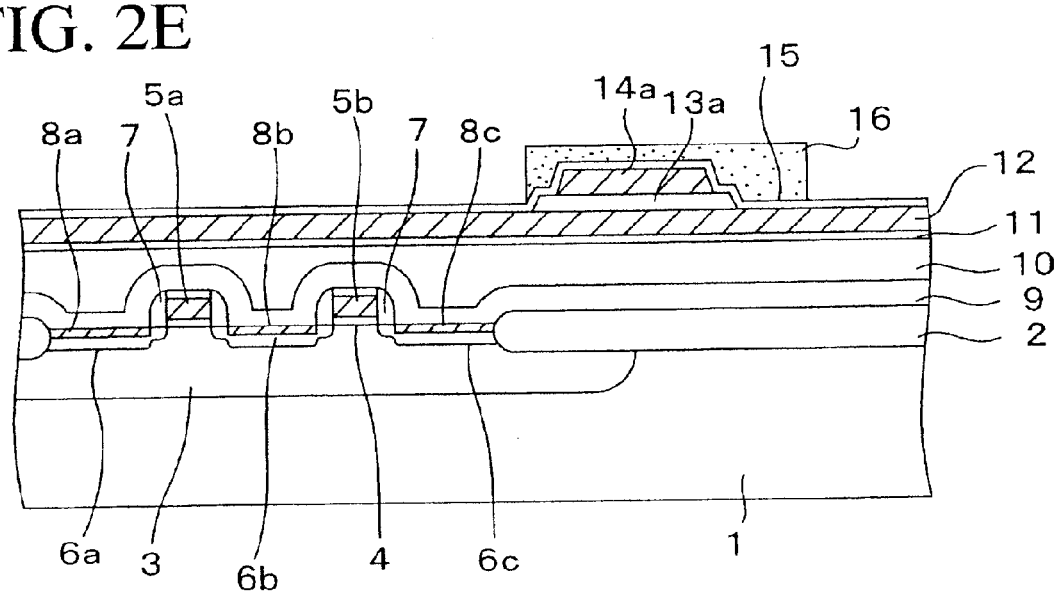

Then, as shown in FIG. 2E, a PZT layer of about 20 nm thickness is formed as an encapsulation layer 15 on the upper electrode 14a, the dielectric layer 13a, and the first conductive layer 12 by the sputtering method. The encapsulation layer 15 has a function of protecting the dielectric layer 13a, which is easily reduced, from the hydrogen. In order to block the hydrogen from entering into the dielectric layer 13a, such encapsulation layer 15 is formed of the PZT that can easily trap the hydrogen. The encapsulation layer 15 is a capacitor protection insulating layer, and may be formed of the layer such as the alumina layer, the titanium oxide layer, etc. which can easily trap or block the hydrogen.

Then, the RTA process is applied to the encapsulation layer 15 at 700° C. for 60 second at the programming rate of 125° C./sec in the oxygen atmosphere.

Then, a resist 16 is coated on the encapsulation layer 15. Then, the resist is exposed/developed to be left in a lower electrode forming region containing the regions that are located under the upper electrode 14a and the dielectric layer 13a.

Figure 2F:
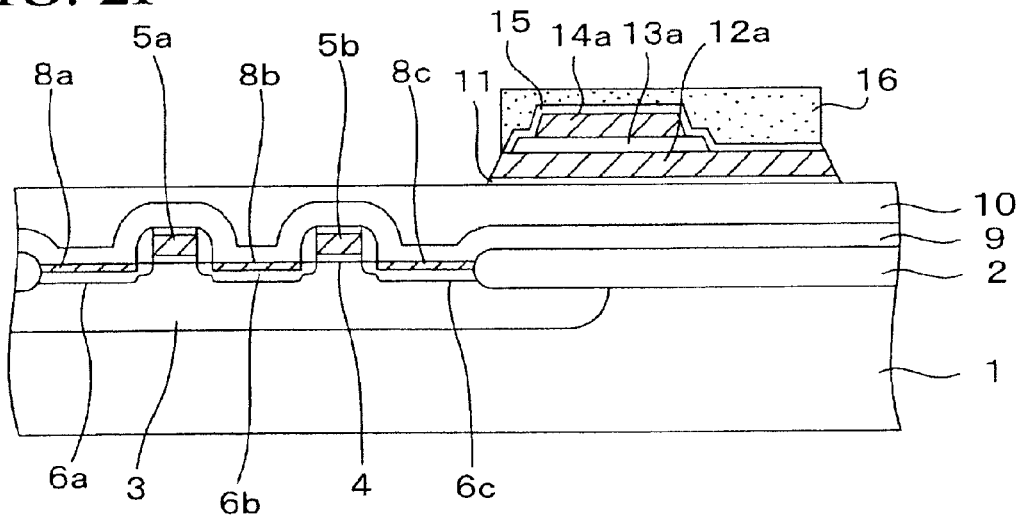

Then, as shown in FIG. 2F, the encapsulation layer 15, the first conductive layer 12, and the titanium oxide layer 11 are etched by using the resist 16 as a mask. Thus, the first conductive layer 12 that is left below the upper electrode 14a is used as a lower electrode 12a of the capacitor.

Figure 2G:
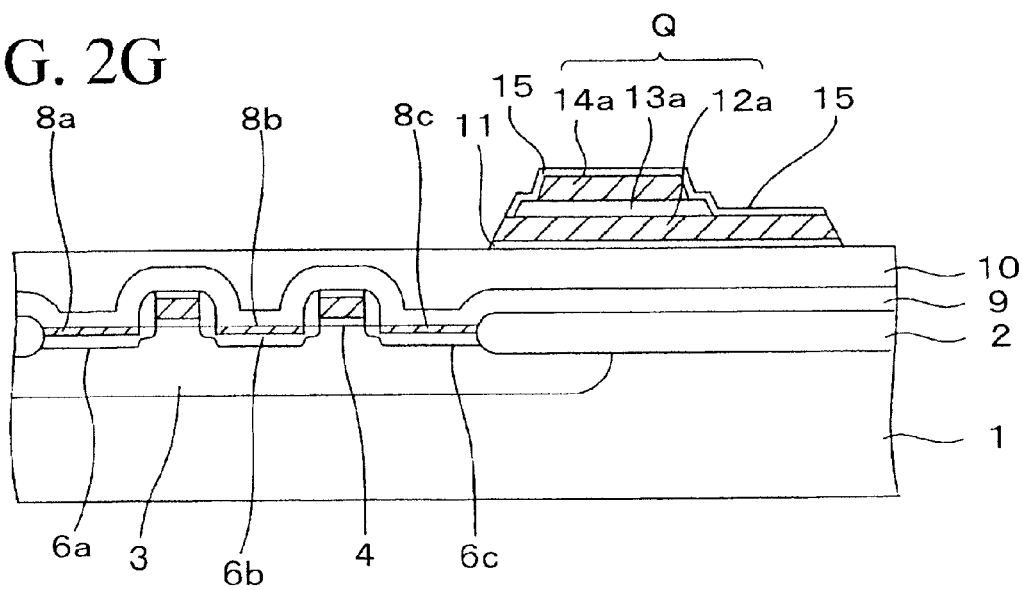

Then, as shown in FIG. 2G, the capacitor Q consisting of the lower electrode 12a, the dielectric layer 13a, and the upper electrode 14a appears on the first interlayer insulating layer 10 after the resist 16 is removed.

Then, in order to recover the dielectric layer 13a from the damage caused by the etching into its original state, the capacitor Q is annealed at the temperature of 650° C. for 60 minute in the oxygen atmosphere, for example.

Figure 2H:
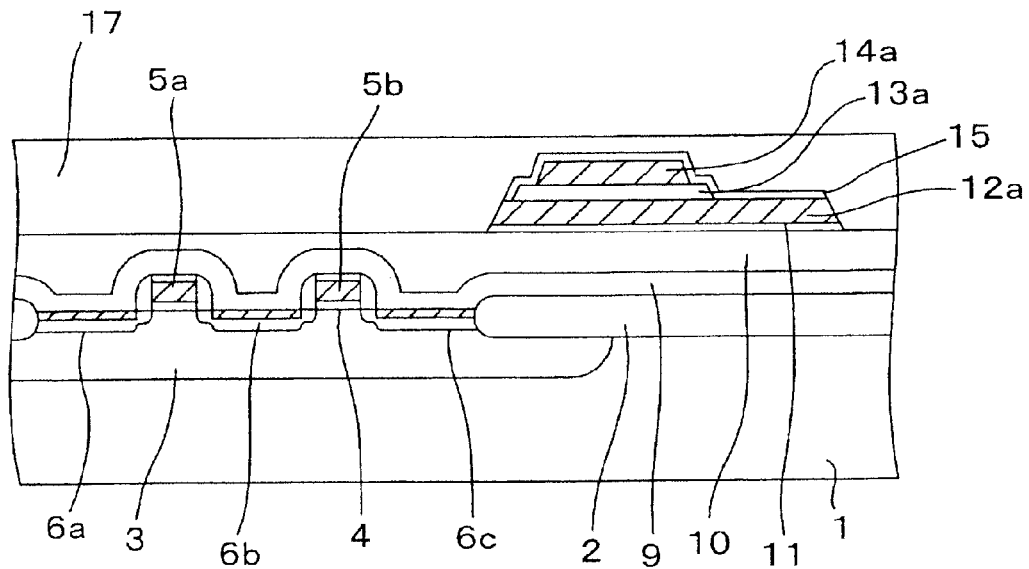

Then, as shown in FIG. 2H, an $SiO_2$ layer of about 1500 nm thickness is formed as a second interlayer insulating layer 17 on the encapsulation layer 15, the capacitor Q, and the first interlayer insulating layer 10. The growth of the second interlayer insulating layer 17 may be executed by the CVD method using silane ($SiH_4$) or may be executed by the plasma CVD method using TEOS, for example. The substrate temperature applied to grow the second interlayer insulating layer 17 is set to about 300 to 450° C.

Then, an upper surface of the second interlayer insulating layer 17 is planarized by the CMP method.

Figure 2I:
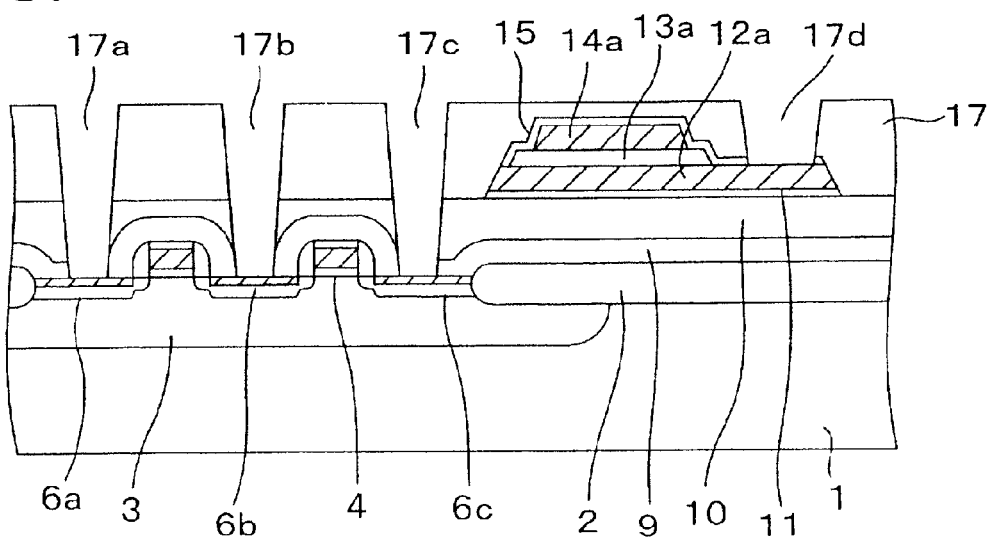

Then, as shown in FIG. 2I, the second interlayer insulating layer 17, the encapsulation layer 15, the first interlayer insulating layer 10, and the oxidation preventing insulating layer 9 are patterned by the photolithography method. Thus, first to fourth contact holes 17a to 17d are formed on the n-type impurity diffusion regions 6a to 6c and on the contact area of the lower electrode 12a respectively. The first interlayer insulating layer 10, the second interlayer insulating layer 17, etc. are etched by using a mixed gas which is prepared by adding Ar to a CF gas, e.g., $CF_4$.

Then, a titanium (Ti) layer of 20 nm thickness and a titanium nitride (TiN) layer of 50 nm thickness are formed on the second interlayer insulating layer 17 and inner surfaces of the contact holes 17a to 17d by the sputtering method. These layers are used as a conductive adhesive layer. Then, a tungsten layer is formed on the adhesive layer by the CVD method using a mixed gas that consists of tungsten hexafluoride ($WF_6$), argon, and hydrogen. In this case, the silane ($SiH_4$) gas is also used in the initial stage of the growth of the tungsten layer. The tungsten layer has a thickness that buries perfectly the contact holes 17a to 17d.

Figure 2J:
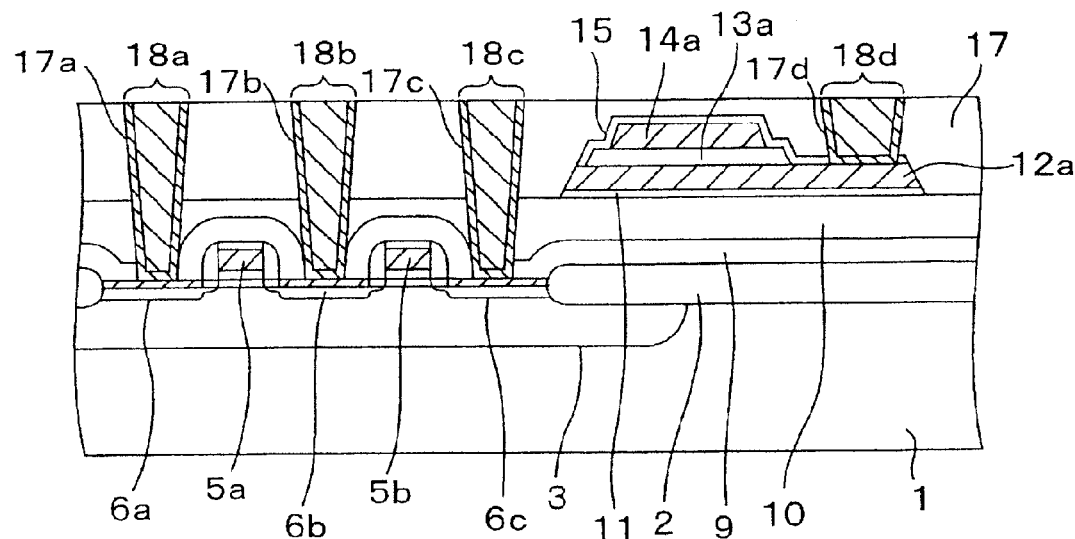

Then, as shown in FIG. 2J, the tungsten layer and the adhesive layer are removed by the CMP method and left only in the contact holes 17a to 17d. Thus, the tungsten layer and the adhesive layer, which are left in the first to fourth contact holes 17a to 17d respectively, are used as first to fourth conductive plugs 18a to 18d.

In this case, in each p-well 3, the second conductive plug 18b formed on the n-type impurity diffusion region 6b, which is put between two gate electrodes 5a, 5b, is connected electrically to the bit line formed over the second conductive plug 18b and also the first and third conductive plugs 18a, 18c formed on both sides of the second conductive plug 18b are connected electrically to the upper electrodes 14a of the capacitors Q via wirings described later respectively.

Figure 2K:
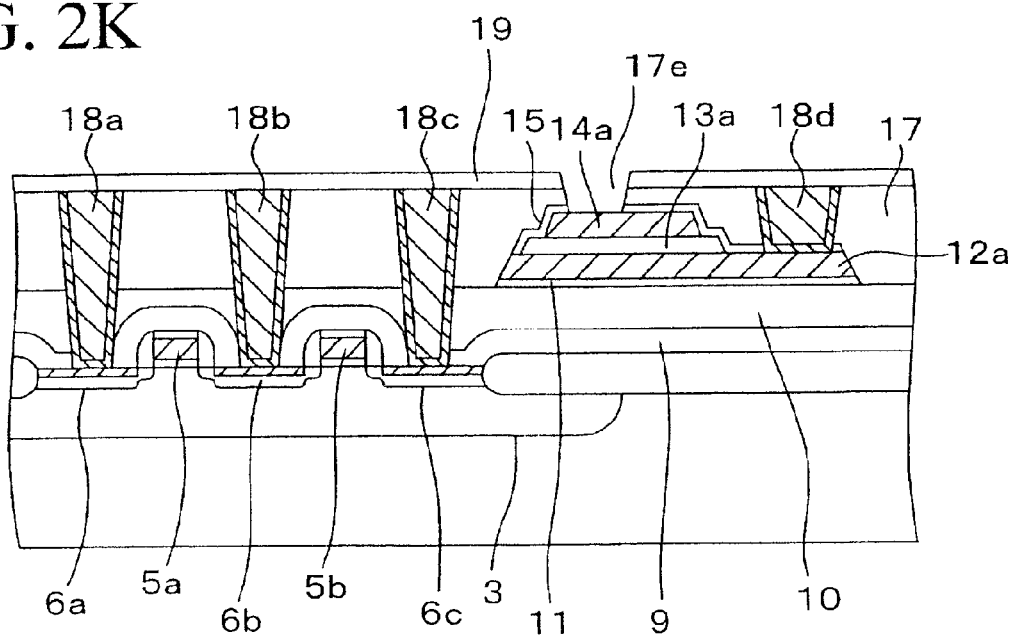

Then, as shown in FIG. 2K, an SiON layer of about 100 nm thickness, for example, is formed on the second interlayer insulating layer 17 and the conductive plugs 18a to 18d by the plasma CVD method. This SiON layer is formed by using a mixed gas consisting of silane ($SiH_4$) and $N_2O$, and is used as an oxidation preventing layer 19 to prevent the oxidation of the conductive plugs 18a to 18d.

Then, the oxidation preventing layer 19, the second interlayer insulating layer 17, and the encapsulation layer 15 are patterned by the photolithography method. Thus, a fifth contact hole 17e having an almost square planar shape, one side of which is 0.35 to 0.50 $\mu$m, is formed on the upper electrode 13a of the capacitor Q.

Figure 3:
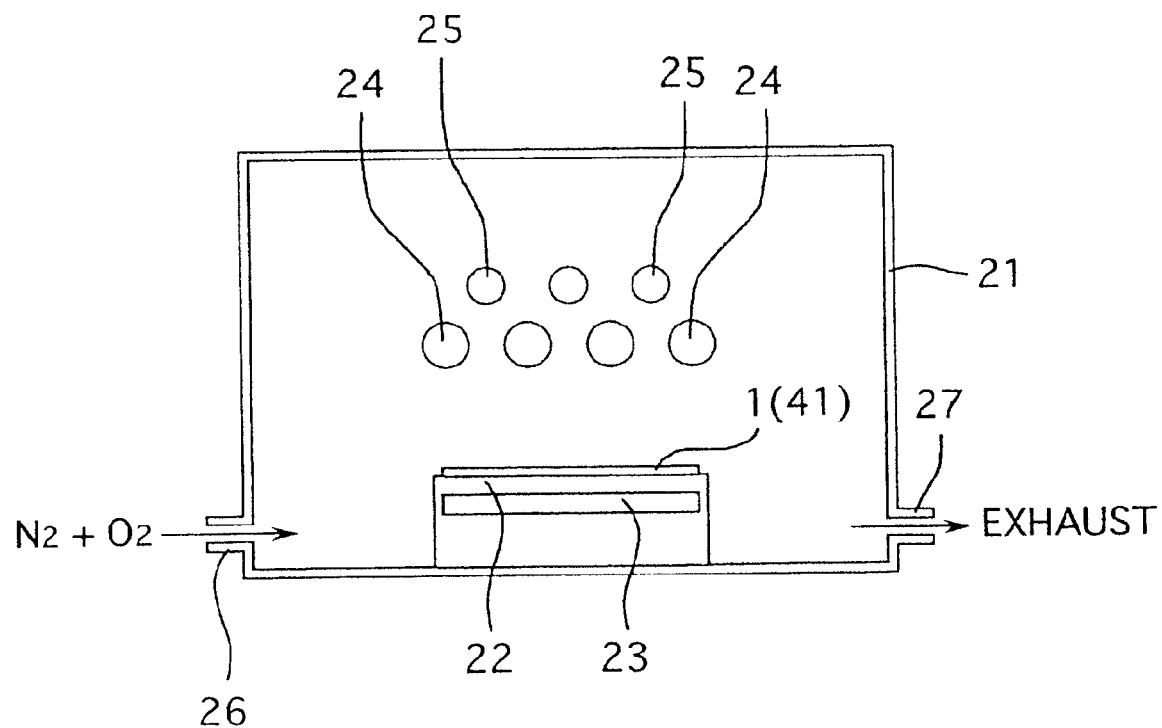
FIG. 3 is a configurative view showing an RTA annealing equipment employed in embodiments of the present invention.

Then, the silicon substrate 1 is put into the RTA annealing equipment shown in FIG. 3. The RTA annealing equipment comprises a chamber 21 into which the silicon substrate 1 is loaded, a suscepter 22 on which the silicon substrate 1 is loaded in the chamber 21, a heater 23 for heating the silicon substrate 1 under the suscepter 22, a plurality of infrared lamps 24 arranged over the suscepter 22, UV (ultraviolet) lamps 25 arranged in clearances between a plurality of infrared lamps 24, and a gas introducing port 26 and an exhaust port 27 provided in the chamber 21. As the UV lamp 25, there is the lamp that has peaks at a wavelength of 225.0 nm and a wavelength of 187.5 nm.

In the chamber 21, the silicon substrate 1 is loaded on the suscepter 22, then oxygen ($O_2$) and nitrogen ($N_2$) are introduced at flow rates of 1.0 liter/min and 9.0 liter/min via the gas introducing port 26 respectively, and then a pressure in the chamber 21 is set to the atmospheric pressure. Also, the silicon substrate 1 is heated up to 300 to 450° C., e.g., 350° C. by the heater 23, the infrared lamps 24, and the UV lamps 25. In this case, the ultraviolet rays are irradiated from the UV lamps 25 to the second interlayer insulating layer 17 and the contact hole 17e. In this case, an inert gas such as argon, or the like may be introduced instead of the nitrogen.

Thus, on surfaces of the second interlayer insulating layer 17 and the contact hole 17e, $o_2$ is changed into ozone ($O_3$) by the ultraviolet rays having the wavelength of 225.0 nm and then $O_3$ is changed into active oxygen radical ($O^*$) by the ultraviolet rays having the wavelength of 187.5 nm. Even if the contact hole 17e is small, the active oxygen is ready to permeate in the dielectric layer 13a via the upper electrode 14a. As a result, the oxygen is supplied sufficiently to the dielectric layer 13a.

In this case, excimer UV lamps may be employed as the UV lamps 25. The ultraviolet rays having a wavelength of 172.5 nm are irradiated from the excimer UV lamps to the second interlayer insulating layer 17 and the contact hole 17e. Then, $O_2$ that is irradiated by the ultraviolet rays is changed into the active oxygen.

Figure 2L:
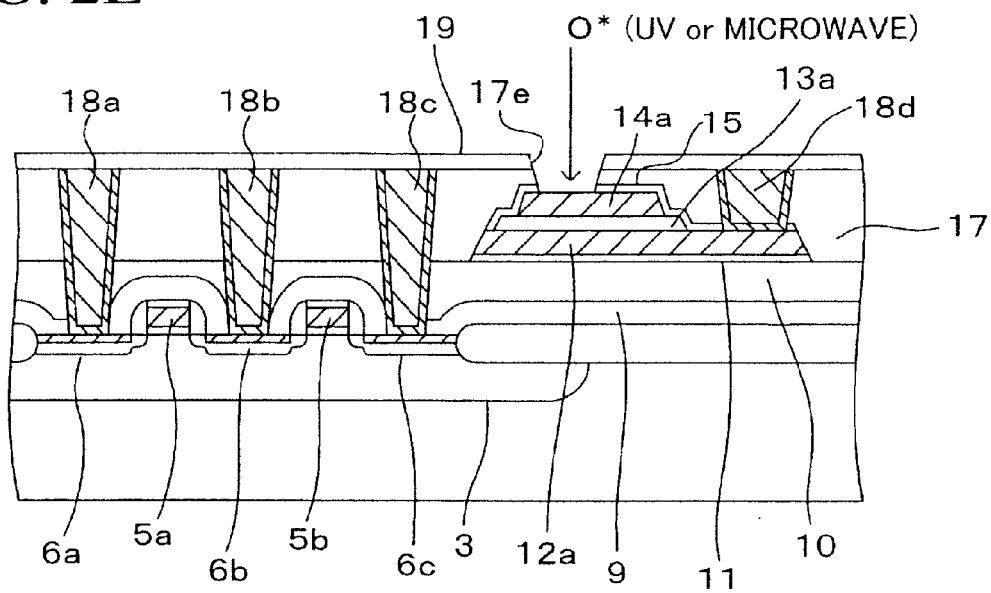

Then, as shown in FIG. 2L, the quality of the dielectric layer 13a is improved by oxygen-annealing the capacitor Q for 30 minute, for example, via the contact hole 17e under the condition that such ultraviolet rays are irradiated to the oxygen. In this case, the oxidation of the conductive plugs 18a to 18d is prevented by the oxidation preventing layer 19. However, since the temperature is set lower than the prior art under such annealing conditions, the oxidation of the conductive plugs 18a to 18d that penetrates the oxidation preventing layer 19 is difficult to proceed rather than the prior art. Therefore, the oxidation preventing layer 19 may be formed thinner than 100 nm.

Then, the oxidation preventing layer 19 is etched back by using the CF gas.

Then, a conductive layer is formed on the second interlayer insulating layer 17 and the conductive plugs 18a to 18d and in the contact hole 17e formed on the upper electrode 14a by the sputter method. As the conductive layer, a multi-layered metal structure in which a titanium nitride layer, a copper-containing aluminum layer, a titanium layer, and a titanium nitride layer are formed sequentially, for example, is employed. An amount of copper contained in the copper-containing aluminum layer is set to 0.5 atoms %, for example.

Figure 2M:
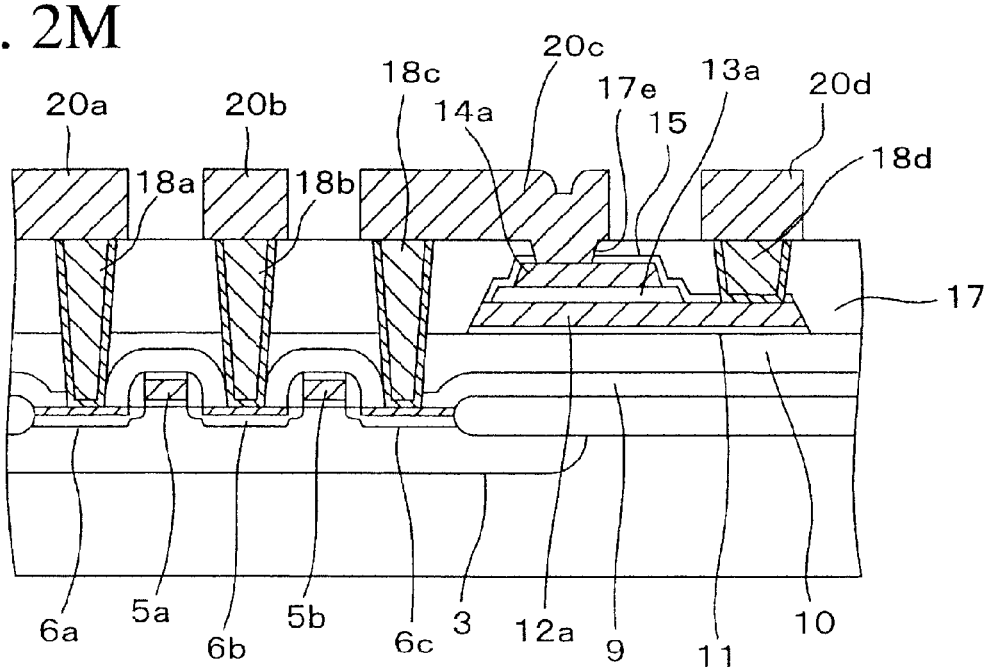

Then, as shown in FIG. 2M, the conductive layer is patterned by the photolithography method. Thus, a wiring 20a that connects electrically the upper electrode 14a of the capacitor Q and the third conductive plug 18c via the contact hole 17e is formed on the second interlayer insulating layer 17. At the same time, a conductive pad 20b is formed on the second conductive plug 18b formed between two gate electrodes 5a, 5b on the p-well 3. Also, another wiring 20d is formed on the conductive plug 18d formed on the lower electrode 12a of the capacitor Q. In addition, still another wiring 20a that is connected to the upper electrode of another capacitor (not shown) is formed on the first conductive plug 18a.

Then, a third interlayer insulating layer, a second-layer conductive plug, the bit line, the cover layer, etc. are formed. But explanation of their details will be omitted herein.

According to the above embodiment, the contact hole 17e is formed in the second interlayer insulating layer 17, which covers the capacitor Q, on the upper electrode 14a. Then, the ultraviolet rays are irradiated to the contact hole 17e and the second interlayer insulating layer 17 when the oxygen is supplied to the capacitor Q via the contact hole 17e.

Therefore, the oxygen is activated on the surface of the second interlayer insulating layer 17, then supply of the oxygen to the capacitor Q via the contact hole 17e is accelerated, and then the oxygen is introduced into the ferroelectric layer 13a by a sufficient amount. As a result, the quality of the ferroelectric layer 13a of the capacitor Q is recovered from the damage that is caused when the contact hole 17e is formed, etc., and thus the characteristics of the capacitor Q is improved.

Figure 4:
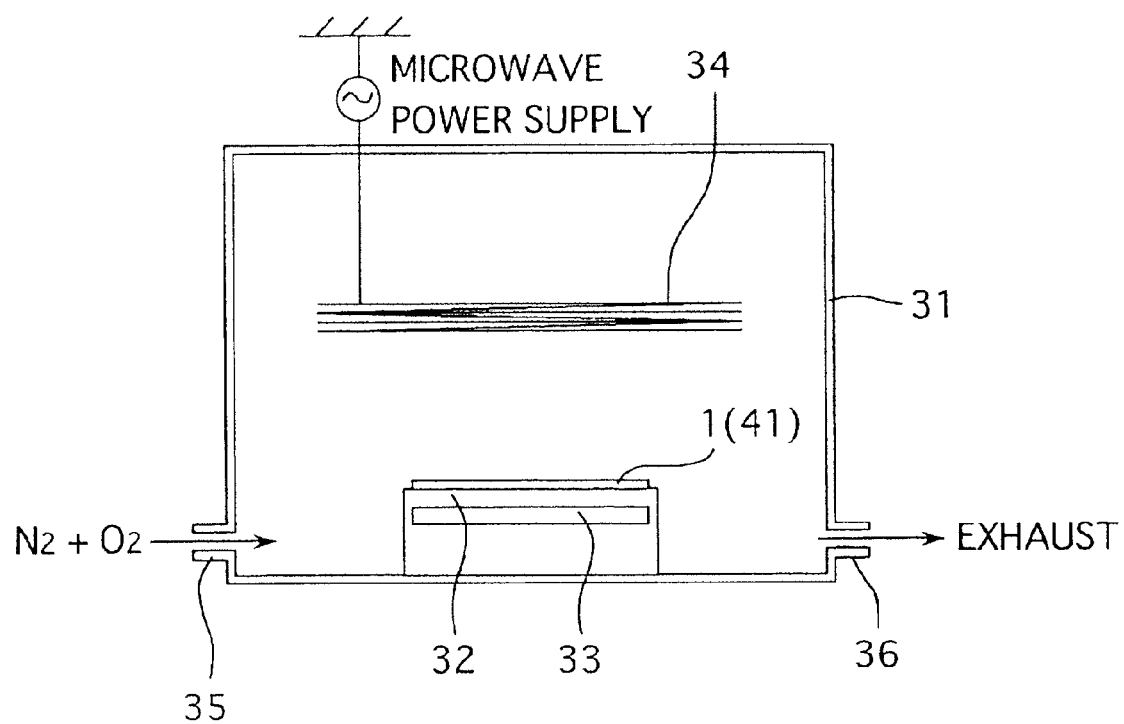
FIG. 4 is a configurative view showing a microwave curing equipment employed in embodiments of the present invention.

Meanwhile, the microwave curing equipment shown in FIG. 4 may be employed when the oxygen is supplied to the upper electrode 14a of the capacitor Q via the contact hole 17e. The microwave curing equipment shown in FIG. 4 comprises a vacuum chamber 31 into which the silicon substrate 1 is put, a suscepter 32 for supporting the silicon substrate 1 in the vacuum chamber 31, a heater 33 for heating the silicon substrate 1 from the bottom, a conductive coil 34 arranged over the silicon substrate 1 and connected to a microwave power supply, and a gas introducing port 35 and an exhaust port 36 provided in the vacuum chamber 31.

In the chamber 31, the silicon substrate 1 is loaded on the suscepter 32, then the oxygen ($O_2$) and the nitrogen ($N_2$) are introduced at flow rates of 1.0 liter/min and 9.0 liter/min via the gas introducing port 35 respectively, and then a pressure in the interior is reduced to about 1 Pa. Also, the microwave is irradiated from the conductive coil 34 to the second interlayer insulating layer 17 and thus the silicon substrate 1 is heated up to 300 to 450° C., e.g., 350° C. by the heater 33 and the microwave.

Thus, $o_2$ is not changed into the oxygen radical on the surface of the second interlayer insulating layer 17, but $o_2$ is activated by the microwave. Hence, even if the contact hole 17e formed on the upper electrode 14a of the capacitor Q is small, the oxygen is ready to permeate in the dielectric layer 13a via the contact hole 17e and thus the oxygen is supplied sufficiently to the dielectric layer 13a.

The quality of the dielectric layer 13a is improved by oxygen-annealing the capacitor Q for 30 minute, for example, via the contact hole 17e under such conditions.

Figure 5:
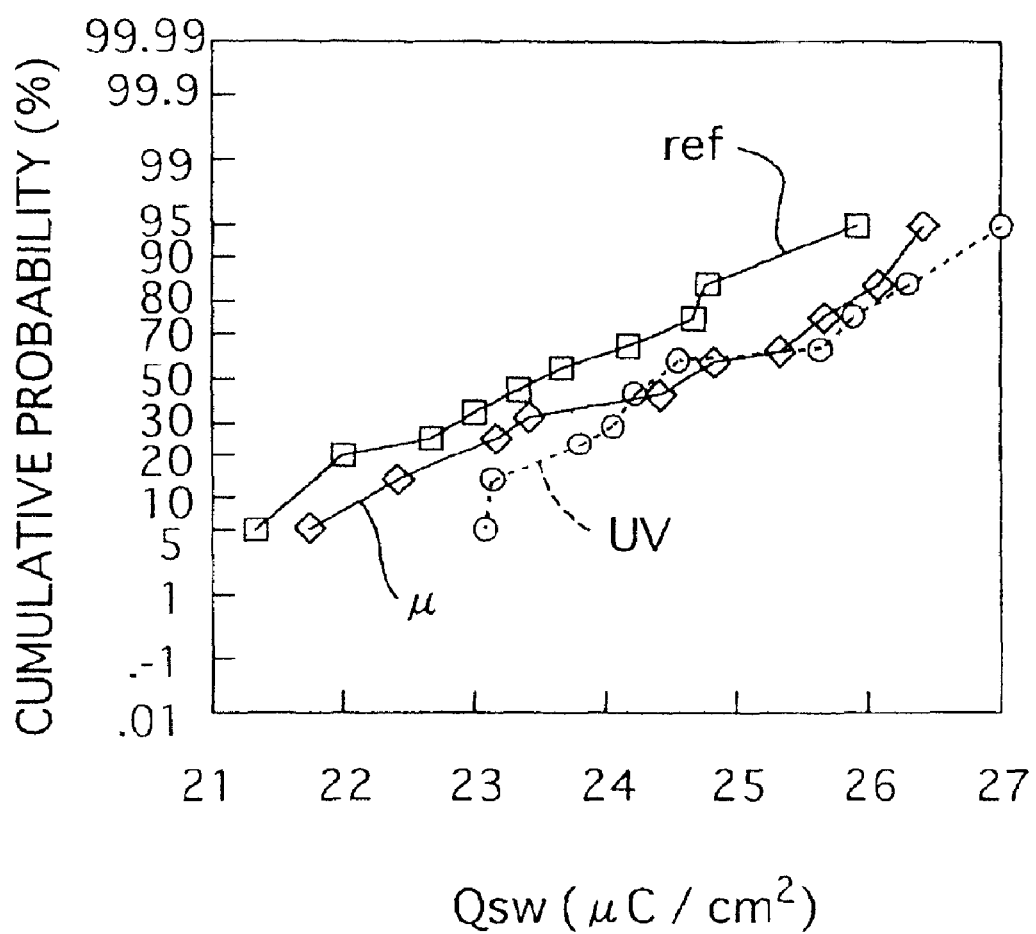
FIG. 5 is a view showing effects of improving capacitor characteristics by the oxygen annealing in the embodiments of the present invention and the oxygen annealing in the prior art.

Next, after the capacitor Q having the upper electrode 14a whose planar shape is 50 $\mu$m×50 $\mu$m is formed, then the second interlayer insulating layer 17 is formed on the capacitor Q, and then the contact hole 17e whose planar shape is about 0.5 $\mu$m×0.5 $\mu$m is formed on the upper electrode 14a, when it was examined how an amount of polarization charge $Q_{SW}$ of the capacitor Q is differentiated by changing the oxygen annealing condition applied to the upper electrode 14a, results shown in FIG. 5 were derived.

In FIG. 5, "ref" indicates the oxygen annealing in the prior art, and indicates results obtained when the capacitor Q was annealed via the contact hole 17e at 550° C. for 60 minute in the atmospheric-pressure oxygen atmosphere. Also, in FIG. 5, "UV" indicates results obtained when the capacitor Q was oxygen-annealed in the chamber 21, into which the oxygen and the nitrogen are introduced at flow rates of 1.0 liter/min and 9.0 liter/min at the atmospheric pressure respectively, while irradiating the ultraviolet rays having a wavelength of 172.5 nm to the second interlayer insulating layer 17 and the contact hole 17e from the excimer UV lamps to set the substrate heated temperature to 350° C. In addition, in FIG. 5, "$\mu$" indicates results obtained when the capacitor Q was oxygen-annealed in the chamber 31, into which the oxygen and the nitrogen are introduced at flow rates of 1.0 liter/min and 9.0 liter/min at the pressure of 1 Pa respectively, while irradiating the microwave to the second interlayer insulating layer 17 and the contact hole 17e to set the substrate heated temperature to 350° C.

According to FIG. 5, because the ultraviolet rays or the microwave is irradiated to the oxygen, an amount of polarization charge of the capacitor is increased higher than that of the capacitor that is subjected to the oxygen-annealing in the conventional conditions. Out of these conditions, the oxygen annealing executed in the condition that the UV is irradiated to the oxygen is most advantageous to improve the capacitor characteristics.

According to FIG. 5, a difference between an effect of an amount of polarization charge achieved by the oxygen annealing according to the present embodiment and an effect of an amount of polarization charge achieved by the oxygen annealing in the prior art looks like small.

However, since a rate of the size of the contact hole 17e to the size of the capacitor Q employed in the experiment in FIG. 5 is extremely small rather than the actual device, it is possible to say that such difference is large as the effect of improving the capacitor characteristics in the actual device.

In the above embodiment, the irradiation of the ultraviolet rays or the microwave onto the oxygen during the oxygen annealing may be employed in other oxygen annealing steps. In this case, the crystallization annealing of the ferroelectric layer 13 is executed not by employing the irradiation of the ultraviolet rays or the microwave but in the conditions in the prior art.

By the way, in the above embodiment, in order to connect electrically the lower electrode 12a and the wiring 20d on the second interlayer insulating layer 17, the conductive plug 18d is formed in the contact hole 17d. However, the wiring 20d may be connected directly to the lower electrode 12a via the contact hole 17d without use of the conductive plug 18d. In this case, the contact hole 17e formed on the upper electrode 14a and the contact hole 17d formed on the lower electrode 12a are opened simultaneously, and then the oxygen radical or the active oxygen is supplied to the capacitor Q via these contact holes 17d, 17e.

In this case, any one of $N_2O$ and $NO_2$ may be employed together with $O_2$ or in place of $O_2$ during the oxygen annealing.

(Second Embodiment)

In the present embodiment, steps of forming the memory cell having the stacked capacitor will be explained hereunder.

FIGS. 6A to 6E are sectional views showing the steps of manufacturing a semiconductor device according to a second embodiment of the present invention.

Figure 6A:
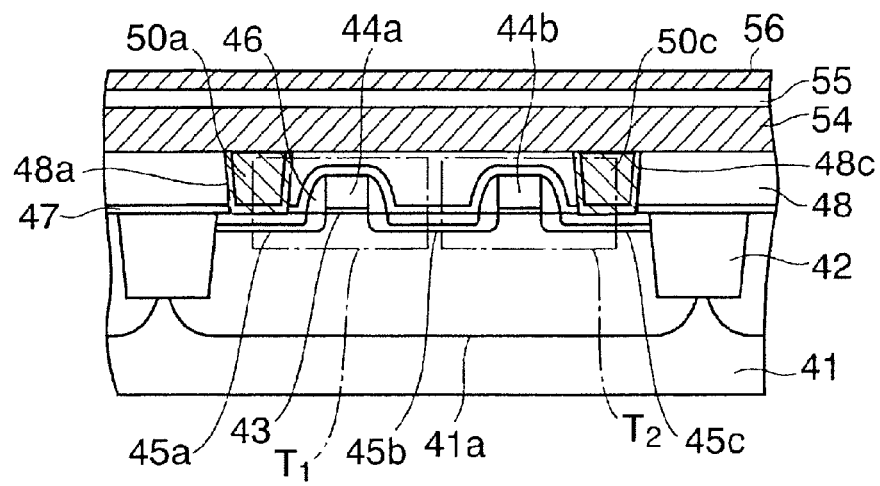
FIGS. 6A to 6E are sectional views showing the steps of manufacturing a semiconductor device according to a second embodiment of the present invention.

Next, steps required until a sectional structure shown in FIG. 6A is formed will be explained hereunder.

First, an element isolation recess is formed around a transistor forming region of an n-type or p-type silicon (semiconductor) substrate 41 by the photolithography method. Then, an element isolation insulating layer 42 is formed by filling silicon oxide ($SiO_2$) in the recess. The element isolation insulating layer 42 having such structure is called STI (Shallow Trench Isolation). In this case, the insulating layer formed by the LOCOS (Local Oxidation of Silicon) method may be employed as the element isolation insulating layer.

Then, a p-type well 41a is formed by introducing the p-type impurity selectively into the transistor forming region of the silicon substrate 41 in the memory cell region.

Then, a silicon oxide layer serving as a gate insulating layer 43 is formed by thermally oxidizing a surface of the p-type well 41a on the silicon substrate 41.

Then, an amorphous silicon or polysilicon layer and a tungsten silicide layer are formed sequentially on an overall upper surface of the silicon substrate 41. Then, gate electrodes 44a, 44b are formed on the p-type well 41a in the memory cell region by patterning the silicon layer and the tungsten silicide layer by virtue of the photolithography method. These gate electrodes 44a, 44b are formed on the silicon substrate 41 via a gate insulating layer 43.

In this case, two gate electrodes 44a, 44b are formed in parallel on one p-type well 41a in the memory cell region. These gate electrodes 44a, 44b constitute a part of the word line.

Then, the n-type impurity, e.g., phosphorus, is ion-implanted into the p-type well 41a on both sides of the gate electrodes 44a, 44b. Thus, first to third n-type impurity diffusion regions 45a to 45c serving as the source/drain are formed.

Then, an insulating layer, e.g., a silicon oxide ($SiO_2$) layer is formed on an overall surface of the silicon substrate 41 by the CVD method. Then, insulating sidewall insulating layers 46 are left on both side portions of the gate electrodes 44a, 44b by etching back the insulating layer.

Then, the n-type impurity is ion-implanted again into the first to third n-type impurity diffusion regions 45a to 45c in the p-type well 41a while using the gate electrodes 44a, 44b and the sidewall insulating layers 46 as a mask. Thus, a high-concentration impurity region is formed in the first to third n-type impurity diffusion regions 45a to 45c respectively.

In this case, in one p-type well 41a, the second n-type impurity diffusion region 45b between two gate electrodes 44a, 44b is connected electrically to the bit line described later whereas the first and third n-type impurity diffusion regions 45a, 45c near both end sides of the p-type well 41a are connected electrically to the lower electrodes of the capacitors described later.

According to the above steps, two n-type MOS transistors $T_1$, $T_2$ having the gate electrodes 44a, 44b and the n-type impurity diffusion regions 45a to 45c of the LDD structure are formed in the p-type well 41a to have one n-type impurity diffusion region 45a commonly.

Then, a silicon oxide nitride (SiON) layer of about 200 nm thickness is formed as an oxidation preventing insulating layer 47, which covers the MOS transistors $T_1$, $T_2$, on the overall surface of the silicon substrate 41 by the plasma CVD method. Then, a silicon oxide ($SiO_2$) of about 1.0 μm thickness is formed as a first interlayer insulating layer 48 on the oxidation preventing insulating layer 47 by the plasma CVD method using the TEOS gas.

Then, the first interlayer insulating layer 48 is annealed in the atmospheric-pressure nitrogen atmosphere at the temperature of 700° C. for 30 minute, for example. Thus, the first interlayer insulating layer 48 is densified. Then, an upper surface of the first interlayer insulating layer 48 is planarized by the chemical mechanical polishing (CMP) method.

Then, the first interlayer insulating layer 48 and the oxidation preventing insulating layer 47 are etched by using a resist pattern (not shown). Thus, first and second contact holes 48a, 48c are formed on the first and third n-type impurity diffusion regions 45a, 45c in the memory cell region respectively.

Then, a titanium (Ti) layer of 20 nm thickness and a titanium nitride (TiN) layer of 50 nm thickness are formed sequentially as a glue layer on an upper surface of the first interlayer insulating layer 48 and inner surfaces of the first and second contact holes 48a, 48c by the sputter method. Then, a tungsten (W) layer is grown on the glue layer by the CVD method using $WF_6$ to bury completely insides of the contact holes 48a, 48c.

Then, the tungsten layer and the glue layer are polished by the CMP method to remove from the upper surface of the first interlayer insulating layer 48. Thus, the tungsten layer and the glue layer being left in the first and second contact holes 48a, 48c respectively are used as first and second conductive plugs 50a, 50c. The first and second conductive plugs 50a, 50c are connected to the first and third n-type impurity diffusion regions 45a, 45c respectively. Also, the first and second conductive plugs 50a, 50c are connected to the capacitors described later respectively.

Then, a first conductive layer 54 is formed on the first and second conductive plugs 50a, 50c and the first interlayer insulating layer 48. As the first conductive layer 54, an iridium (Ir) layer of 200 nm thickness, an iridium oxide ($IrO_2$) layer of 30 nm thickness, a platinum oxide (PtO) layer of 30 nm thickness, and a platinum (Pt) layer of 50 nm thickness, for example, are formed sequentially by the sputter method.

In this case, the first interlayer insulating layer 48 is annealed to prevent the film peeling-off, for example, before or after the first conductive layer 54 is formed. As the annealing method, the RTA (Rapid Thermal Annealing) executed at 750° C. for 60 second in the argon atmosphere, for example, is employed.

Then, a PZT layer of 200 nm thickness, for example, is formed as a ferroelectric layer 55 on the first conductive layer 54 by the sputter method. As the method of forming the ferroelectric layer 55, there are the MOD (Metal Organic Deposition) method, the MOCVD (Metal Organic CVD) method, the sol-gel method, etc. in addition to the above. Also, as the material of the ferroelectric layer 55, other PZT material such as PLCSZT, PLZT, etc., Bi-layered structure compound material such as $SrBi_2Ta_2O_9$, $SrBi_2(Ta,Nb)_2O_9$, etc., and other metal oxide ferroelectric substances may be employed in addition to PZT.

Then, the ferroelectric layer 55 is crystallized by executing the annealing in the oxygen-containing atmosphere. As the annealing, two-step RTA process having a first step, which is executed at the substrate temperature of 600° C. for 90 second in the mixed gas atmosphere consisting of argon (Ar) and oxygen ($O_2$), and a second step, which is executed at the substrate temperature of 750° C. for 60 second in the oxygen atmosphere, for example, is employed.

Then, an iridium oxide ($IrO_2$) layer of 200 nm thickness, for example, is formed as a second conductive layer 56 on the ferroelectric layer 55 by the sputter method.

Then, a hard mask (not shown) that covers the capacitor forming region is formed on the second conductive layer 56.

Figure 6B:
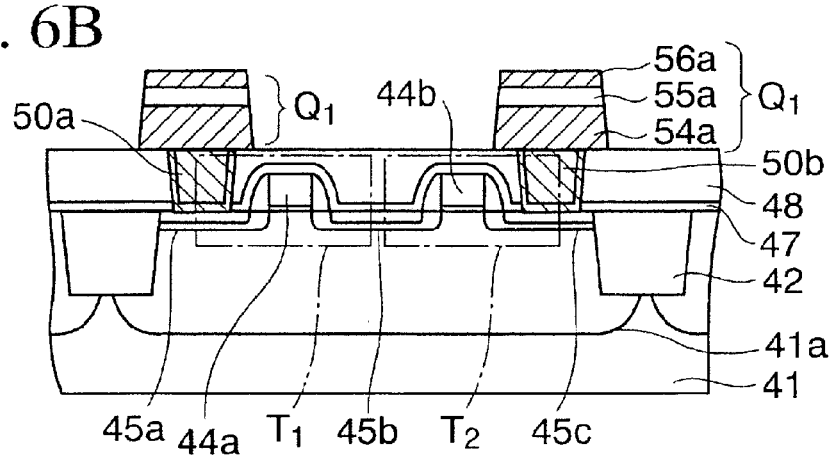

Then, as shown in FIG. 6B, capacitors $Q_1$ are formed on the first interlayer insulating layer 48 by etching sequentially the second conductive layer 56, the ferroelectric layer 55, and the first conductive layer 54 in the region that is not covered with the hard mask. In this case, the second conductive layer 56, the ferroelectric layer 55, and the first conductive layer 54 are etched by the sputter reaction in the atmosphere containing a halogen element.

The capacitor $Q_1$ consists of a lower electrode 54a made of the first conductive layer 54, a dielectric layer 55a made of the ferroelectric layer 55, and an upper electrode 56a made of the second conductive layer 56.

Two capacitors $Q_1$ are formed over one p-well 41a, and their lower electrodes 54a are connected electrically to the first or third n-type impurity diffusion region 45a, 45c via the first or second conductive plug 50a, 50c respectively. The hard mask is removed after patterns of the capacitors $Q_1$ are formed.

Then, in order to recover the quality of the ferroelectric layer 55 from the damage caused by the etching, the recovery annealing is executed. The recovery annealing in this case is executed at the substrate temperature of 650° C. for 60 minute in the furnace containing the oxygen, for example.

Also, as described in the first embodiment, the recovery annealing may be executed by irradiating the ultraviolet rays or the microwave to the first interlayer insulating layer 48 and the capacitors $Q_1$ at the substrate temperature of 300 to 450° C. in the oxygen atmosphere. According to such conditions, because the tungsten constituting the first and second conductive plugs 50a, 50c is heated at the relatively low temperature, such tungsten is hard to be oxidized and thus generation of the abnormal oxidation of the conductive plugs 50a, 50c is suppressed.

Figure 6C:
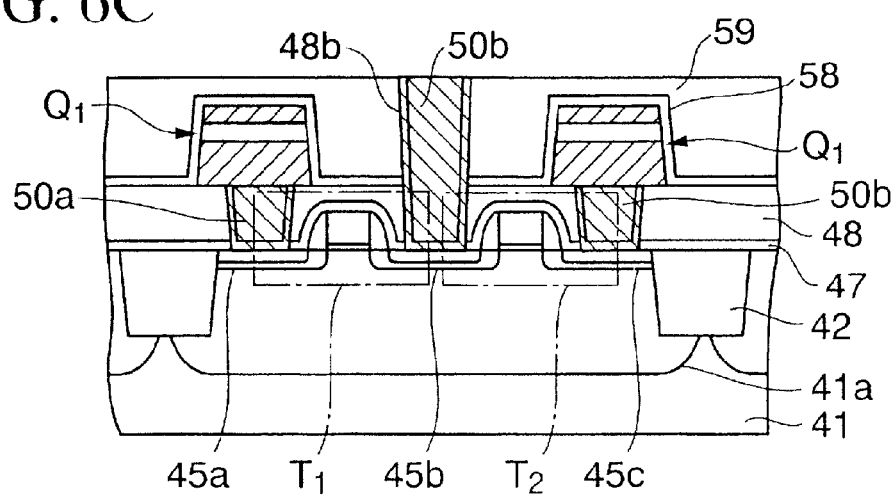

Next, steps required until a structure shown in FIG. 6C is formed will be explained hereunder.

First, alumina of 50 nm thickness is formed as an encapsulation layer 58 on the capacitors $Q_1$ and the first interlayer insulating layer 48 by the sputter method. This encapsulation layer 58 protects the capacitors $Q_1$ from the process damage, and may be formed of PZT in addition to the alumina. Then, the first interlayer insulating layer 48 and the capacitors $Q_1$ are annealed at 650° C. for 60 minute in the oxygen atmosphere in the furnace.

Then, a silicon oxide ($SiO_2$) layer of about 1.0 μm thickness is formed as a second interlayer insulating layer 59 on the encapsulation layer 58 by the plasma CVD method using the HDP (High Density Plasma) equipment.

Then, an upper surface of the second interlayer insulating layer 59 is made flat by the CMP method. In this example, a remaining thickness of the second interlayer insulating layer 59 after the CMP is set to about 300 nm on the upper electrode 16a.

Then, a third contact hole 48b is formed on the second n-type impurity diffusion region 45b by patterning the second interlayer insulating layer 59, the encapsulation layer 58, the first interlayer insulating layer 48, and the oxidation preventing insulating layer 47. Then, a third conductive plug 50b having a triple-layered structure consisting of titanium, titanium nitride, and tungsten is formed in the third contact hole 48b.

Figure 6D:
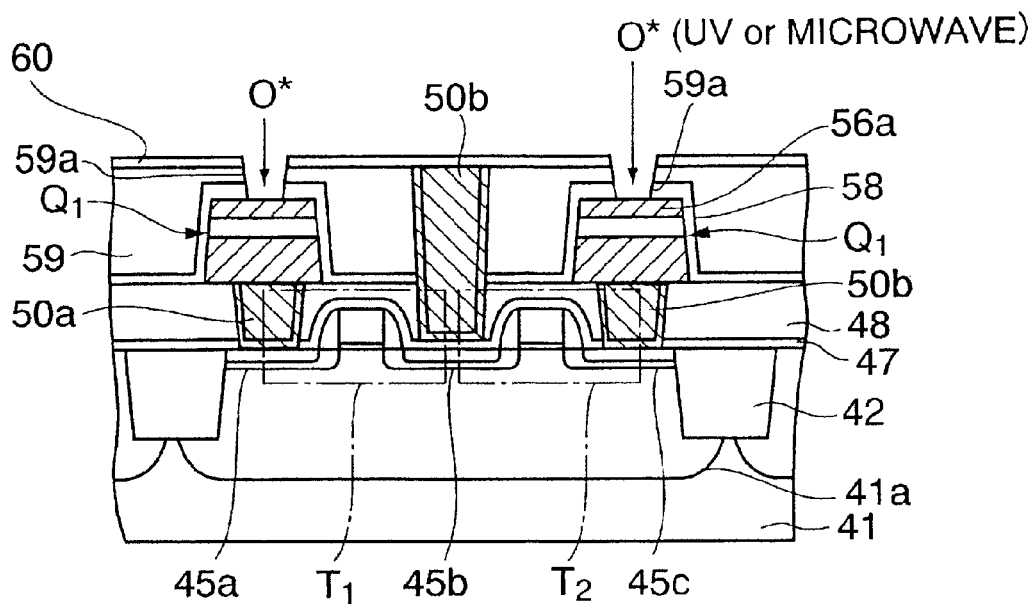

Next, steps required until a structure shown in FIG. 6D is formed will be explained hereunder.

First, an SiON layer of about 100 nm thickness, for example, is formed on the second interlayer insulating layer 59 and the third conductive plug 50b by the plasma CVD method. This SiON layer is formed by using a mixed gas that consists of silane ($SiH_4$) and $N_2O$, and is used as an oxidation preventing layer 60 to prevent the oxidation of the third conductive plug 50b.

Then, the encapsulation layer 58, the second interlayer insulating layer 59, and the oxidation preventing layer 60 are patterned by the photolithography method. Thus, contact holes 59a each having an almost square planar shape, one side of which is 0.35 to 0.50 μm, are formed on the upper electrodes 56a of the capacitors $Q_1$.

Then, in accordance with the method shown in the first embodiment, the quality of the dielectric layer 55a is improved by executing the annealing at the substrate temperature of 300 to 450° C., e.g., 350° C. while supplying the oxygen, onto which the ultraviolet rays or the microwave is irradiated, for example, to the capacitors $Q_1$ via the contact holes 59a. In this case, the oxidation of the third conductive plug 50b is prevented by the oxidation preventing layer 60.

Then, the oxidation preventing layer 60 is etched back by using the CF gas.

Then, a conductive layer is formed on the second interlayer insulating layer 59 and the third conductive plug 50b and in the contact holes 59a formed on the upper electrodes 14a by the sputter method. As the conductive layer, a multi-layered metal structure constructed by forming sequentially a titanium nitride layer, a copper-containing aluminum layer, a titanium layer, and a titanium nitride layer, for example, is employed. An amount of copper contained in the copper-containing aluminum layer is set to 0.5 atoms %, for example.

Figure 6E:
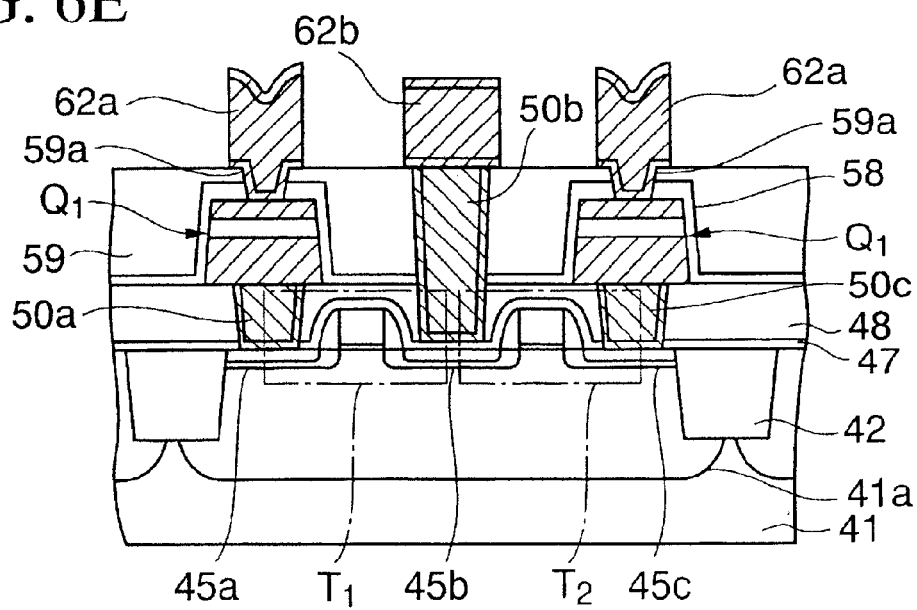

Then, as shown in FIG. 6E, wirings 62a that are connected electrically to the upper electrodes 14a of the capacitor $Q_1$ are formed by patterning the conductive layer by means of the photolithography method. At the same time, a conductive pad 62b is formed on the third conductive plug 50b that is formed on the second n-type impurity diffusion region 45b.

Then, the third interlayer insulating layer, the second-layer conductive plug, the bit line, the cover layer, etc. are formed. But explanation of their details will be omitted herein.

In the memory cell forming steps described above, the oxygen annealing applied after the contact holes 59a are formed on the upper electrodes 56a of the capacitors $Q_1$ is executed in the condition that the substrate temperature is set to the low temperature of 300 to 450° C. while irradiating the ultraviolet rays or the microwave to the oxygen.

Therefore, like the first embodiment, not only can the capacitor characteristics be easily recovered by accelerating the permeation of oxygen into the capacitors $Q_1$ via the contact holes 59a even if the size of the contact holes 59a is reduced, but also the oxygen annealing can be executed at the relatively low temperature. As a result, the abnormal oxidation of the tungsten constituting the conductive plugs 50a to 50c can be prevented or suppressed.

In this case, any one of $N_2O$ and $NO_2$ may be employed together with $O_2$ or in place of $O_2$ during the oxygen annealing.

As described above, according to the present invention, since the activated oxygen is supplied to the capacitor via the hole while heating the semiconductor substrate, the oxygen is ready to permeate into the capacitor via the hole and the oxygen can be coupled easily with the capacitor. Therefore, it is possible to supply the oxygen sufficiently to the oxide dielectric layer of the capacitor. As a result, even if the size of the hole is reduced, the recovery of the capacitor characteristics can be achieved sufficiently by the oxygen annealing.

What is claimed is:

1. A method of manufacturing a semiconductor device, comprising the steps of:

forming a first insulating layer over a semiconductor substrate;

forming a first conductive layer, an oxide dielectric layer, and a second conductive layer over the first insulating layer;

forming a capacitor, which consists of an upper electrode made of the second conductive layer, a dielectric layer made of the oxide dielectric layer, and a lower electrode made of the first conductive layer, by patterning the second conductive layer, the oxide dielectric layer, and the first conductive layer;

forming a second insulating layer over the capacitor and the first insulating layer;

forming a hole in the second insulating layer over the upper electrode; and then supplying an activated oxygen to the capacitor via the hole in a state that the semiconductor substrate is heated.

2. A method of manufacturing a semiconductor device, according to claim 1, wherein the oxygen is activated by irradiating any one of ultraviolet rays and a microwave.

3. A method of manufacturing a semiconductor device, according to claim 2, wherein heating of the semiconductor substrate is executed not only by any one of the ultraviolet rays and the microwave but also by a heater.

4. A method of manufacturing a semiconductor device, according to claim 3, wherein the heater is at least any one of an infrared lamp arranged over the semiconductor substrate and a heater arranged below the semiconductor substrate.

5. A method of manufacturing a semiconductor device, according to claim 2, wherein the oxygen that is activated by irradiating the ultraviolet rays is oxygen radical.

6. A method of manufacturing a semiconductor device, according to claim 1, wherein a temperature applied to heat the semiconductor substrate when the oxygen is supplied to the capacitor is set in a range of 300 to 450° C.

7. A method of manufacturing a semiconductor device, according to claim 2, wherein the ultraviolet rays are irradiated from an excimer UV lamp that has a wavelength peak at 172.5 nm.

8. A method of manufacturing a semiconductor device, according to claim 2, wherein the ultraviolet rays are irradiated from a ultraviolet lamp that has wavelength peaks of at 187.5 nm and 225.0 nm.

9. A method of manufacturing a semiconductor device, according to claim 2, wherein the microwave is irradiated from a conductive coil that is connected to a microwave power supply.

10. A method of manufacturing a semiconductor device, according to claim 2, wherein the oxygen is introduced into a low-pressure atmosphere in which the semiconductor substrate, and then the microwave is irradiated to the oxygen.

11. A method of manufacturing a semiconductor device, according to claim 1, wherein the oxygen is introduced into a space over the second insulating layer together with an inert gas.

12. A method of manufacturing a semiconductor device, according to claim 1, wherein the second conductive layer is made of at least one of iridium and iridium oxide.

13. A method of manufacturing a semiconductor device, according to claim 1, wherein the oxide dielectric layer is a ferroelectric layer.

14. A method of manufacturing a semiconductor device, according to claim 1, further comprising the step of forming an upper electrode leading wiring, which is connected electrically to the upper electrode via the hole, on the second insulating layer after the oxygen is supplied to the capacitor.

15. A method of manufacturing a semiconductor device, according to claim 1, further comprising the steps of:

forming a contact hole on an upper surface of the lower electrode in an area, which protrudes from the upper electrode, by patterning the second insulating layer; and forming a lower electrode leading wiring, which is connected electrically to the lower electrode via the contact hole, on the second insulating layer.

16. A method of manufacturing a semiconductor device, according to claim 15, further comprising the step of forming a conductive plug in the contact hole.

17. A method of manufacturing a semiconductor device, according to claim 1, further comprising the step of forming a conductive plug, which is connected to a lower surface of the lower electrode, before the first conductive layer is formed on the first insulating layer.

* * * * *